United States Patent
Zhang

(10) Patent No.: US 9,466,620 B2
(45) Date of Patent: Oct. 11, 2016

(54) METHOD FOR MANUFACTURING ARRAY SUBSTRATE, ARRAY SUBSTRATE, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Jinzhong Zhang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/488,029

(22) Filed: Sep. 16, 2014

(65) Prior Publication Data

US 2015/0279866 A1  Oct. 1, 2015

(30) Foreign Application Priority Data

Mar. 31, 2014 (CN) .......................... 2014 1 0126488

(51) Int. Cl.
*H01L 29/24* (2006.01)
*H01L 27/12* (2006.01)
(Continued)

(52) U.S. Cl.
CPC ......... *H01L 27/1237* (2013.01); *G02F 1/1362* (2013.01); *H01L 21/31111* (2013.01); *H01L 21/32051* (2013.01); *H01L 21/32133* (2013.01);
(Continued)

(58) Field of Classification Search
CPC ................ H01L 2924/00; H01L 2224/45147; H01L 27/12; H01L 21/3213

USPC .............. 257/147, 369, 347, 57, 59, 40
See application file for complete search history.

(56) References Cited

U.S. PATENT DOCUMENTS

| | | | |
|---|---|---|---|
| 6,211,928 B1 | 4/2001 | Oh et al. | |
| 2012/0107982 A1* | 5/2012 | Song | H01L 27/1214 438/30 |
| 2013/0037814 A1* | 2/2013 | Oh | H01L 21/28008 257/59 |

FOREIGN PATENT DOCUMENTS

| CN | 102629046 A | 8/2012 |
|---|---|---|
| CN | 103489892 A | 1/2014 |

OTHER PUBLICATIONS

First Chinese Office Action regarding Application No. 2014101264882 dated Jan. 12, 2016. English translation provided by Dragon Intellectual Property Law Firm.
(Continued)

*Primary Examiner* — Chuong A Luu
*Assistant Examiner* — Rodolfo Fortich
(74) *Attorney, Agent, or Firm* — Harness, Dickey & Pierce, P.L.C.

(57) ABSTRACT

The present invention relates to the field of liquid crystal display, and provides a method for manufacturing an array substrate, the array substrate, and a display device. In the array substrate, a gate insulating layer between source and drain electrodes and a pattern of a gate electrode has a thickness greater than that of the gate insulating layer between an active layer and the pattern of the gate electrode. Due to the thick gate insulating layer between the source and drain electrodes and the pattern of the gate electrodes, the capacitance between the source and drain electrodes and the gate electrodes will be reduced.

20 Claims, 11 Drawing Sheets

(51) Int. Cl.
    *H01L 21/311*     (2006.01)
    *H01L 21/3213*     (2006.01)
    *H01L 21/768*     (2006.01)
    *H01L 21/3205*     (2006.01)
    *H01L 21/56*     (2006.01)
    *H01L 29/423*     (2006.01)
    *H01L 29/417*     (2006.01)
    *H01L 29/786*     (2006.01)
    *H01L 29/66*     (2006.01)
    *H01L 23/31*     (2006.01)
    *G02F 1/1362*     (2006.01)

(52) U.S. Cl.
    CPC ......... *H01L 21/56* (2013.01); *H01L 21/76802* (2013.01); *H01L 23/3171* (2013.01); *H01L 27/127* (2013.01); *H01L 29/41733* (2013.01); *H01L 29/42384* (2013.01); *H01L 29/66765* (2013.01); *H01L 29/78684* (2013.01); *G02F 2001/136236* (2013.01); *H01L 2924/0002* (2013.01)

(56) References Cited

OTHER PUBLICATIONS

Second Chinese Office Action regarding Application No. 2014101264882 dated May 12, 2016. English translation provided by Dragon Intellectual Property Law Firm.

* cited by examiner

METHOD FOR MANUFACTURING ARRAY SUBSTRATE, ARRAY SUBSTRATE, AND DISPLAY DEVICE

CROSS REFERENCE

The present application claims a priority of the Chinese patent application No. 201410126488.2 filed on Mar. 31, 2014, the disclosures of which are incorporated herein by reference in its entirety.

TECHNICAL FIELD

The present invention relates to the field of liquid crystal display, in particular to a method for manufacturing an array substrate, the array substrate, and a display device.

BACKGROUND

Currently, a liquid crystal display (LCD) mainly comprises a liquid crystal panel, which includes a thin film transistor (TFT) array substrate, a color filter substrate, and liquid crystals arranged therebetween. The TFT array substrate is a mainstream one now, and usually it includes a multilayered structure consisting of a gate electrode layer, a gate insulating layer, an active layer, a source/drain electrode layer, an insulation protecting layer, and a pixel electrode layer. Generally, a layer of a non-metallic material is deposited by plasma-enhanced chemical deposition. An important improvement in the liquid crystal display is to enhance an aperture ratio and reduce power consumption. In order to enhance the aperture ratio, usually two ITO layers and multilayered wiring are arranged on the TFT array substrate. However, the capacitance between source and drain electrodes and a gate electrode will be relatively large, and a load of the TFT will be increased, and as a result, the power consumption of a liquid crystal display screen is very high. A battery of an existing mobile phone generally has poor endurance, and it is required to reduce the power consumption. However, there are few schemes in the prior art for reducing the capacitance between the source and drain electrodes and the gate electrode. Meanwhile, due to the low free electron mobility of the active layer, the capacitance of the gate insulating layer cannot be reduced too much; otherwise, it is difficult to charge the battery.

Hence, due to the large capacitance between the source and drain electrodes and the gate electrode in the prior art, the load of the TFT and the load of a pixel will be increased, thereby the power consumption of the entire display device will be increased too.

SUMMARY

An object of the present invention is to provide a method for manufacturing an array substrate with low power consumption, so as to prevent an increase in the load of a TFT and the load of a pixel due to the large capacitance between source and drain electrodes and a gate electrode in the prior art, thereby to reduce the power consumption of the entire display device.

In one aspect, the present invention provides a method for manufacturing an array substrate with low power consumption, comprising:

subjecting a gate insulating layer in a region between a source electrode and a drain electrode to a partial etching treatment by a one-time patterning process;

forming an active layer by a one-time patterning process, the active layer covering a partially-etched region of the gate insulating layer; and forming a pattern of a gate electrode by a one-time patterning process, the pattern of the gate electrode covering the partially-etched region of the gate insulating layer and a region of the gate insulating layer corresponding to the source and drain electrodes.

The pattern of the gate electrode and the active layer are located at different sides of the gate insulating layer, and the gate insulating layer between the source and drain electrodes and the pattern of the gate electrode has a thickness greater than that of the gate insulating layer between the active layer, located between the source electrode and the drain electrode, and the pattern of the gate electrode.

In the array substrate, the gate insulating layer between the source and drain electrodes and the pattern of the gate electrode has a thickness greater than that of the gate insulating layer between the active layer and the pattern of the gate electrode. Due to the thick gate insulating layer between the source and drain electrodes and the pattern of the gate electrode, the capacitance between the source and drain electrodes and the gate electrode will be reduced. In addition, the capacitance between the active layer and the pattern of the gate electrode remains unchanged. As a result, it is able to reduce the capacity of Cgs and Cgd corresponding to the source electrode and the drain electrode respectively and reduce the load of a pixel, thereby to reduce the power consumption of the entire display device without affecting a display effect of the array substrate.

The step of subjecting the gate insulating layer in the region between the source electrode and the drain electrode to the partial etching treatment by a one-time patterning process comprises:

subjecting the gate insulating layer in the region between the source electrode and the drain electrode to a partial etching treatment by a half-exposure process, and subjecting a via-hole region of the gate insulating layer to a full-exposure treatment, so as to form a via-hole in the gate insulating layer.

The region between the source electrode and the drain electrode and the via-hole region are formed by a one-time patterning process. As a result, merely the one-time patterning process is required, and it is able to simplify the manufacturing process.

When the pattern of the gate electrode is located at a side adjacent to a substrate, the method comprises:

forming the pattern of the gate electrode on the substrate;

forming the gate insulating layer on the substrate with the pattern of the gate electrode;

forming the active layer on the gate insulating layer;

forming the source electrode, the drain electrode and a pixel electrode layer on the active layer; and forming a passivation layer and a slit-like common electrode layer on the the source electrode, the drain electrode and the pixel electrode layer, the pixel electrode being electrically connected to the drain electrode.

When the pattern of the gate electrode is located at a side away from a substrate, the method comprises:

forming the active layer on the substrate;

forming the source electrode, the drain electrode and a pixel electrode layer on the active layer;

forming the gate insulating layer on the source electrode, the drain electrode and the pixel electrode layer;

forming the pattern of the gate electrode on the gate insulating layer; and forming a passivation layer and a slit-like common electrode layer on the pattern of the gate electrode.

The gate insulating layer and the active layer are deposited separately. The gate insulating layer between the source electrode and the drain electrode is exposed at a half-exposure mode and partially etched, so that the capacitance between the active layer and the gate electrode substantially remains unchanged. The thickness of the gate insulating layer between the source and drain electrodes and the pattern of the gate electrode is increased, and the capacitance between the source and drain electrodes and the pattern of the gate electrode is reduced. In addition, the patterning process for the via-hole is performed before that for the active layer, so the number of times of the patterning process during the manufacturing procedure remains unchanged.

The gate insulating layer has a thickness of 6000 Å to 8000 Å in a region other than the region between the source electrode and the drain electrode.

Due to the thick insulating dielectric layer between the source and drain electrodes and the gate electrode, the capacitance between the source and drain electrodes and the gate electrode and the electric energy loss will be small. As a result, it is able to remarkably reduce the power consumption.

The gate insulating layer has a thickness of 3000 Å to 4000 Å in the region between the source electrode and the drain electrode.

A capacitor formed by the active layer and the gate electrode is configured to form a channel after receiving the current, so the capacity of the capacitor shall not be too small. Otherwise, the current flowing therethrough is low, and as a result, it is easy to cause a muted color excited in a pixel unit, thereby to cause an adverse display effect. In the present invention, the gate insulating layer between the active layer and the gate electrodes has a small thickness, and the capacity of Cga remains unchanged, i.e., it is able to ensure the capacity of Cga.

In another aspect, the present invention provides an array substrate, comprising:
a gate insulating layer;
an active layer, a source electrode and a drain electrode covering one side of the gate insulating layer; and
a pattern of a gate electrode covering the other side of the gate insulating layer.

The gate insulating layer between the source and drain electrodes and the pattern of the gate electrode has a thickness greater than that of the gate insulating layer between the active layer, located between the source electrode and the drain electrode, and the pattern of the gate electrode.

In the array substrate of the above embodiments, the gate insulating layer between the source and drain electrodes and the pattern of the gate electrode has a thickness greater than that of the gate insulating layer between the active layer and the pattern of the gate electrode. Due to the thick gate insulating layer between the source and drain electrodes and the pattern of the gate electrode, the capacitance between the source and drain electrodes and the gate electrode will be reduced. In addition, the capacitance between the active layer and the pattern of the gate electrode remains unchanged. As a result, it is able to reduce the capacity of Cgs and Cgd corresponding to the source electrode and the drain electrode respectively and reduce the load of a pixel, thereby to reduce the power consumption of the entire display device without affecting a display effect of the array substrate.

When the pattern of the gate electrode is located at a side adjacent to a substrate, the array substrate comprises:
the pattern of the gate electrode formed on the substrate;
the gate insulating layer formed on the pattern of the gate electrode and the substrate;
the active layer formed on the gate insulating layer;
the source electrode, the drain electrode and a pixel electrode layer formed on the active layer; and
a passivation layer and a slit-like common electrode layer formed on the source electrode, the drain electrode and the pixel electrode layer, the pixel electrode being electrically connected to the drain electrode.

When the pattern of the gate electrode is located at a side away from a substrate, the array substrate comprises:
the active layer formed on the substrate;
the source electrode, the drain electrode and a pixel electrode layer formed on the active layer;
the gate insulating layer formed on the source electrode, the drain electrode and the pixel electrode layer;
the pattern of the gate electrode formed on the gate insulating layer; and
a passivation layer and a slit-like common electrode layer formed on the pattern of the gate electrode.

The gate insulating layer and the active layer are deposited separately. The gate insulating layer between the source electrode and the drain electrode is exposed at a half-exposure mode and partially etched, so that the capacitance between the active layer and the gate electrode substantially remains unchanged. The thickness of the gate insulating layer between the source and drain electrodes and the pattern of the gate electrode is increased, and the capacitance between the source and drain electrodes and the pattern of the gate electrode is reduced. In addition, the patterning process for the via-hole is performed before that for the active layer, so the number of times of the patterning process during the manufacturing procedure remains unchanged.

The gate insulating layer has a thickness of 6000 Å to 8000 Å in a region other than a region between the source electrode and the drain electrode.

Due to the thick insulating dielectric layer between the source and drain electrodes and the gate electrodes, the capacitance between the source and drain electrodes and the gate electrodes and the electric energy loss will be small. As a result, it is able to remarkably reduce the power consumption.

The gate insulating layer has a thickness of 3000 Å to 4000 Å in the region between the source electrode and the drain electrode.

A capacitor formed by the active layer and the gate electrode is configured to form a channel after receiving the current, so the capacitor of the capacitor shall not be too small. Otherwise, the current flowing therethrough is relatively small, and as a result, it is easy to cause a muted color excited in a pixel unit, thereby to cause an adverse display effect. In the present invention, the gate insulating layer between the active layer and the gate electrode has a small thickness, and the capacity of Cga remains unchanged, i.e., it is able to ensure the capacity of Cga.

In yet another aspect, the present invention provides a display device comprising the above-mentioned array substrate.

In the array substrate, the gate insulating layer between the source and drain electrodes and the pattern of the gate electrode has a thickness greater than that of the gate insulating layer between the active layer and the pattern of the gate electrode. Due to the thick gate insulating layer between the source and drain electrodes and the pattern of the gate electrode, the capacitance between the source and drain electrodes and the gate electrodes will be reduced. In addition, the capacitance between the active layer and the pattern of the gate electrode remains unchanged. As a result, it is able to reduce the capacity of Cgs and Cgd corresponding to the source electrode and the drain electrode respectively and reduce the load of a pixel, thereby to reduce the power consumption of the entire display device without affecting a display effect of the array substrate.

DETAILED DESCRIPTION

The present invention provides an array substrate with low power consumption. In the array substrate, a gate insulating layer between source and drain electrodes and a pattern of a gate electrode has a thickness greater than that of the gate insulating layer between an active layer and the pattern of the gate electrode. Due to the thick gate insulating layer between the source and drain electrodes and the pattern of the gate electrode, the capacitance between the source and drain electrodes and the gate electrode will be reduced. In addition, the capacitance between the active layer and the pattern of the gate electrode remains unchanged. As a result, it is able to reduce the capacity of Cgs and Cgd corresponding to the source electrode and the drain electrode respectively and reduce the load of a pixel, thereby to reduce the power consumption of the entire display device.

The present invention will be described hereinafter in conjunction with the drawings and the embodiments.

Figure 1:
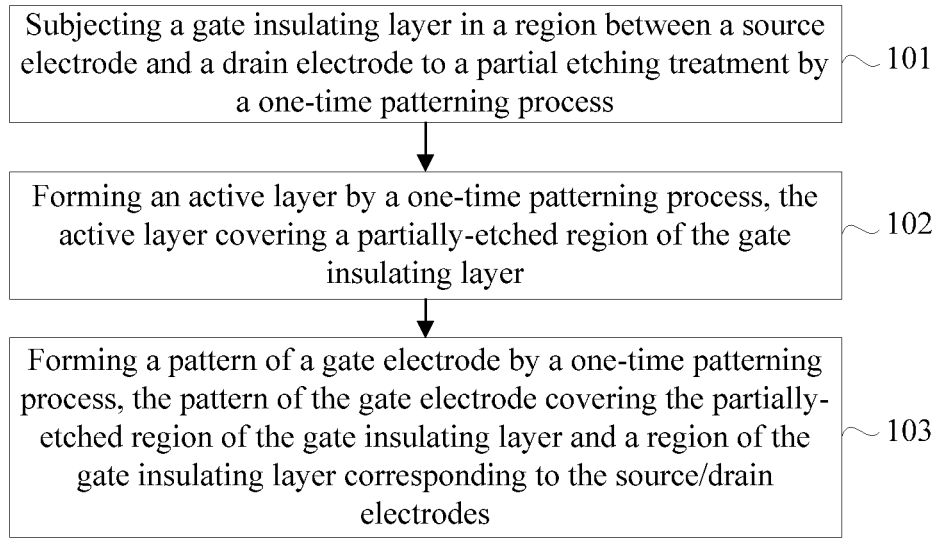
FIG. 1 is a flow chart of a method for manufacturing an array substrate according to an embodiment of the present invention.

As shown in FIG. 1, a method for manufacturing an array substrate comprises the steps of:

Step 101: subjecting a gate insulating layer in a region between a source electrode and a drain electrode to a partial etching treatment by a one-time patterning process;

Step 102: forming an active layer by a one-time patterning process, the active layer covering a partially-etched region of the gate insulating layer; and Step 103: forming a pattern of a gate electrode by a one-time patterning process, the pattern of the gate electrode covering the partially-etched region of the gate insulating layer and a region of the gate insulating layer corresponding to the source and drain electrodes.

The pattern of the gate electrode and the active layer are located at different sides of the gate insulating layer, and the gate insulating layer between the source and drain electrodes and the pattern of the gate electrode has a thickness greater than that of the gate insulating layer between the active layer, located between the source electrode and the drain electrode, and the pattern of the gate electrode.

The Step 101 of subjecting the gate insulating layer in the region between the source electrode and the drain electrode to the partial etching treatment by a one-time patterning process comprises: subjecting the gate insulating layer in the region between the source electrode and the drain electrode to the partial etching treatment by a half-exposure process, and subjecting a via-hole region of the gate insulating layer to a full-exposure treatment, so as to form a via-hole in the gate insulating layer. A layer of photoresist is coated onto the gate insulating layer. The photoresist in a region between the source electrode and the drain electrode corresponding to the pattern of the gate electrode is subjected to a half-exposure treatment through a semipermeable membrane or grating, and the photoresist in a via-hole region corresponding to the pattern of the gate electrode is subjected to a full-exposure treatment. All the photoresist in the via-hole region, and the photoresist with a certain thickness that has been exposed in the region between the source electrode and the drain electrode, are removed through an exposure and development treatment.

The gate insulating layer has a thickness of 6000 Å to 8000 Å in a region other than the region between the source electrode and the drain electrode, and the gate insulating layer has a thickness of 3000 Å to 4000 Å in the region between the source electrode and the drain electrode.

In a traditional method for manufacturing the array substrate, a channel is formed in the region between the source electrode and the drain electrode when being powered on. Capacitors of a traditional TFT include a capacitor Cgs between the gate electrode and the source electrode, a capacitor Cga between the gate electrode and the active layer, and a capacitor Cgd between the gate electrode and the drain electrode. The capacitor Cga is mainly related to the electron distribution that will affect the properties of the TFT. The current flows through the capacitor Cga to form the channel, so that the electrons directionally migrate to a pixel electrode. When the pixel electrode is controlled through the current, the current is required to flow through the source electrode at first, then through the channel region and the drain electrode, and finally through a first ITO layer connected to the drain electrode, so as to transmit the current to the pixel electrode. When the current flows through the source electrode and the drain electrode, due to the existence of the capacitors Cgs and Cgd, a relatively large current intensity is required to break energy barriers of Cgs and Cgd. In order to provide the large current intensity, it is required to provide a high voltage. However, the higher the voltage, the higher the power consumption when the electric energy is converted into the other kind of energy, and as a result, unnecessary power consumption will occur.

The capacitor formed by the active layer and the gate electrode is configured to form the channel after receiving the current, so the capacity of the capacitor shall not be too small. Otherwise, the current flowing therethrough will be small, and as a result, it is easy to cause a muted color excited in a pixel unit, thereby to cause an adverse display effect. In the present invention, the gate insulating layer between the active layer and the gate electrode has a thickness of 3000 Å to 4000 Å, which may be equal to a thickness of the gate insulating layer between the active layer and the gate electrode in the prior art. The capacity of Cga remains unchanged, i.e., it is able to ensure the capacity of Cga.

Two different array substrates may be manufactured according to the method of the present invention, and these two conditions will be described hereinafter.

First Embodiment

Figure 2:
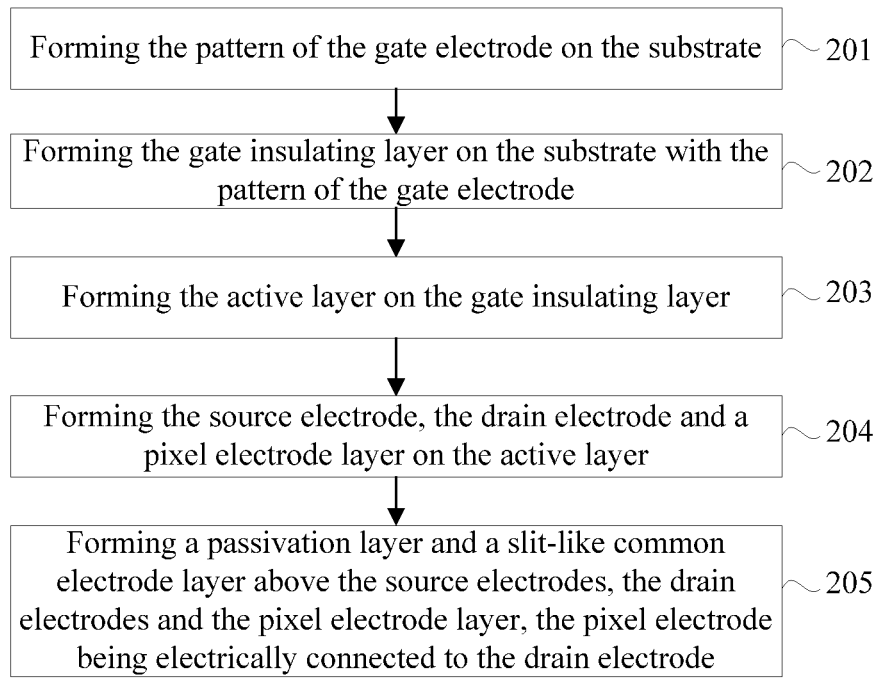
FIG. 2 is a flow chart of the method for manufacturing the array substrate where a pattern of a gate electrode is located at a side adjacent to a substrate according to an embodiment of the present invention.

As shown in FIG. 2, the method for manufacturing the array substrate where the pattern of the gate electrode is located at a side adjacent to the substrate comprises the steps of:

Step 201: forming the pattern of the gate electrode on the substrate;

Step 202: forming the gate insulating layer on the substrate with the pattern of the gate electrode;

Step 203: forming the active layer on the gate insulating layer;

Step 204: forming the source electrode, the drain electrode and a pixel electrode layer on the active layer; and Step 205: forming a passivation layer and a slit-like common electrode layer on the source electrodes, the drain electrodes and the pixel electrode layer, the pixel electrode being electrically connected to the drain electrode.

In Step 201, forming the pattern of the gate electrode on the substrate by a one-time patterning process.

In Step 202, the gate insulating layer formed on the substrate with the pattern of the gate electrode has a thickness about twice the thickness of the gate insulating layer in the prior art, i.e., about 6000 Å to 8000 Å.

Step 203 comprises: coating a layer of photoresist onto the gate insulating layer, subjecting the photoresist in the region between the source electrode and the drain electrode corresponding to the pattern of the gate electrode to a half-exposure treatment by an exposure and development process, and subjecting the photoresist in the via-hole region corresponding to the pattern of the gate electrode to a full-exposure treatment; removing all the photoresist in the via-hole region and the photoresist with a certain thickness that has been exposed in the region between the source electrode and the drain electrode through an exposure and development treatment; removing all the gate insulating layer corresponding to the via-hole region by an etching process to form a pattern of the via-hole; removing the remaining photoresist in the region between the source electrode and the drain electrode by an ashing process, and removing the gate insulating layer with a predetermined thickness in the region between the source electrode and the drain electrode by an etching process, so that the remaining gate insulating layer in the region between the source electrode and the drain electrode has a thickness substantially equal to the gate insulating layer in the prior art. The remaining gate insulating layer has a thickness of about 3000 Å to 4000 Å. In this embodiment, the pattern of the via-hole and the pattern of the region between the source electrode and the drain electrode are formed by a one-time patterning process, while in the prior art, these patterns are formed by two patterning processes.

The substrate with the pattern of the via-hole and the pattern of the region between the source electrode and the drain electrode are coated with a layer of photoresist, and the photoresist corresponding to the pattern of the region between the source electrode and the drain electrode is removed by the exposure and development process. A surface of the pattern of the region between the source electrode and the drain electrode is treated with hydrogen plasma, and then a layer of A–Si:H and a layer of N+Si:H are deposited on the pattern of the region between the source electrode and the drain electrode by a one-time patterning process, and the active layer is formed. In the active layer, N+Si:H is a semiconductor material and can produce electrons. When the current flows therethrough, it is able to weaken the energy barriers of the source electrode and the drain electrode.

Step 204 comprises: forming the source electrodes and the drain electrodes on the substrate with the active layer by a one-time patterning process; depositing a layer of materials for forming the source electrode and the drain electrode on the pattern of the via-hole; and removing the materials for forming the source electrode and the drain electrode deposited on a pattern of the channel region by a one-time patterning process using a wet etching method, and removing N+Si:H deposited on the pattern of the channel region using a dry etching method. The materials for forming the source electrode and the drain electrode include, but not limited to, Mo, and Mo/Al/Mo. The first ITO layer is formed on the substrate with the source electrode and the drain electrode as the pixel electrode, and a pattern of the pixel electrode is formed so as to be connected to the drain electrode.

Step 205 comprises: depositing the passivation layer on the substrate with the first ITO layer and forming the via-hole in the passivation layer by a one-time patterning process; depositing a second ITO layer on the substrate with the passivation layer, and etching the second ITO layer into a bar-like structure by a one-time patterning process, so as to form a pattern of the slit-like common electrode; and transmitting a signal to the source electrode, the drain electrode and the gate electrode through the second ITO layer and the via-hole in the passivation layer.

Figure 3:
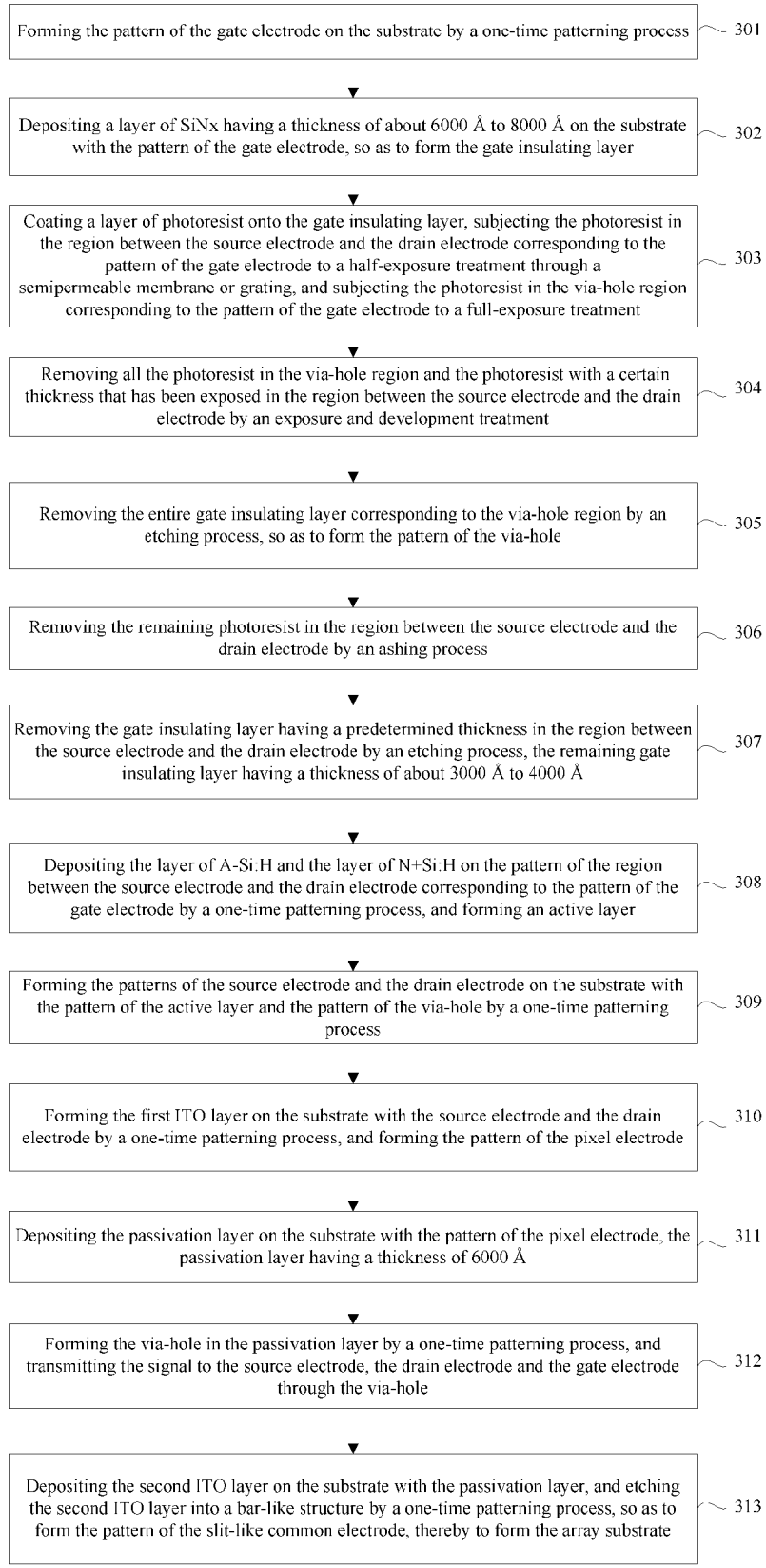
FIG. 3 is a specific flow chart of the method for manufacturing the array substrate where the pattern of the gate electrode is located at a side adjacent to the substrate according to an embodiment of the present invention.

As shown in FIG. 3, the method for manufacturing the array substrate where the pattern of the gate electrode is located at a side adjacent to the substrate comprises the following steps.

Figure 4:
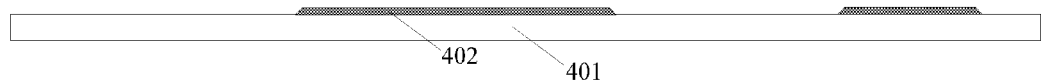
FIG. 4 is a schematic view showing the substrate with the pattern of the gate electrode according to an embodiment of the present invention.

Step 301: forming the pattern of the gate electrode on the substrate by a one-time patterning process. FIG. 4 is a schematic view showing the substrate with the pattern of the gate electrode, where 401 represents the substrate, and 402 represents the pattern of the gate electrode.

Figure 5:
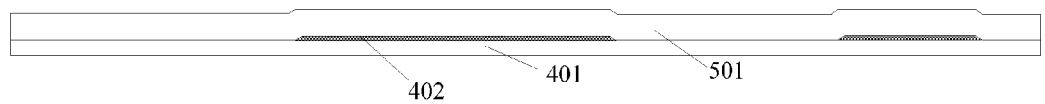
FIG. 5 is a schematic view showing the substrate after a gate insulating layer is deposited according to an embodiment of the present invention.

Step 302: depositing a layer of SiNx having a thickness of about 6000 Å to 8000 Å on the substrate with the pattern of the gate electrode, so as to form the gate insulating layer. FIG. 5 is a schematic view showing the substrate on which the gate insulating layer is deposited, where 501 represents the gate insulating layer.

Figure 6:
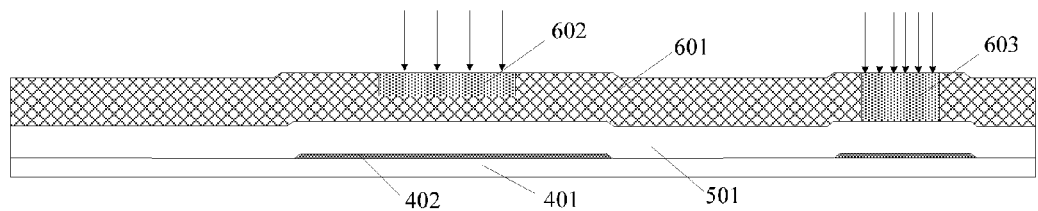
FIG. 6 is a schematic view showing the substrate coated with a photoresist and being subjected to an exposure treatment according to an embodiment of the present invention.

Step 303: coating a layer of photoresist onto the gate insulating layer, subjecting the photoresist in the region between the source electrode and the drain electrode corresponding to the pattern of the gate electrode to a half-exposure treatment through a semipermeable membrane or grating, and subjecting the photoresist in the via-hole region corresponding to the pattern of the gate electrode to a full-exposure treatment. FIG. 6 is a schematic view showing the substrate coated with the photoresist and being subjected to an exposure treatment, where 601 represents the layer of photoresist, 602 represents the photoresist in the region between the source electrode and the drain electrode that is subjected to the half-exposure treatment, and 603 represents the photoresist in the via-hole region that is subjected to the full-exposure treatment.

Figure 7:
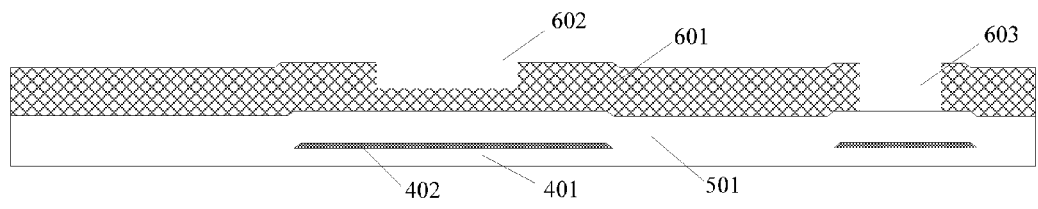
FIG. 7 is a schematic view showing the substrate with the exposed photoresist being removed according to an embodiment of the present invention.

Step 304: removing all the photoresist in the via-hole region and the photoresist with a certain thickness that has been exposed in the region between the source electrode and the drain electrode by an exposure and development treatment. FIG. 7 is a schematic view showing the substrate with the exposed photoresist being removed.

Figure 8:
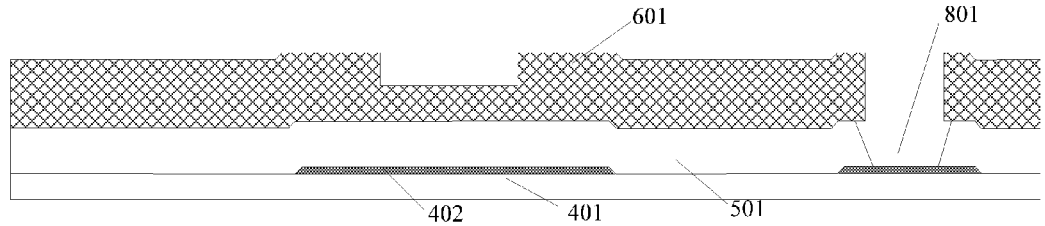
FIG. 8 is a schematic view showing the substrate formed with a pattern of a via-hole according to an embodiment of the present invention.

Step 305: removing the entire gate insulating layer corresponding to the via-hole region by an etching process, so as to form the pattern of the via-hole. FIG. 8 is a schematic view showing the substrate with the pattern of the via-hole, where 801 represents the pattern of the via-hole.

Figure 9:
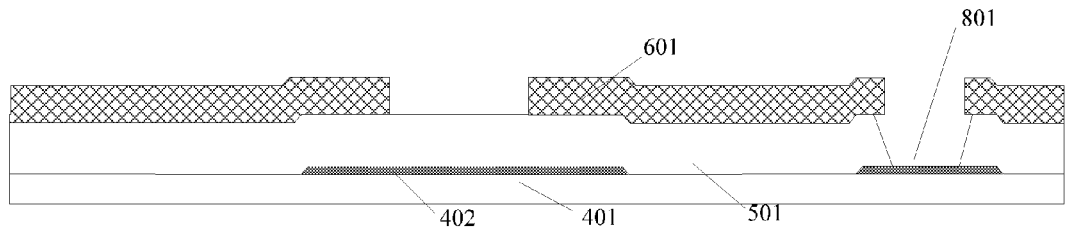
FIG. 9 is a schematic view showing the substrate after being treated with an ashing process according to an embodiment of the present invention.

Step 306: removing the remaining photoresist in the region between the source electrode and the drain electrode by an ashing process. FIG. 9 is a schematic view showing the substrate treated with an ashing process.

Figure 10:
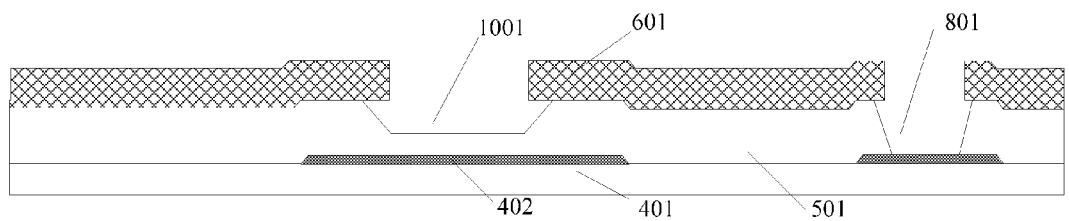
FIG. 10 is a schematic view showing the substrate with the gate insulating layer, having a predetermined thickness within a region between a source electrode and a drain electrode, being removed according to an embodiment of the present invention.

Step 307: removing the gate insulating layer having a predetermined thickness in the region between the source electrode and the drain electrode by an etching process, the remaining gate insulating layer may have a thickness of about 3000 Å to 4000 Å. FIG. 10 is a schematic view showing the substrate with the gate insulating layer, having a predetermined thickness in the region between the source electrode and the drain electrode, being removed, where 1001 represents the pattern of the region between the source electrode and the drain electrode.

Figure 11:
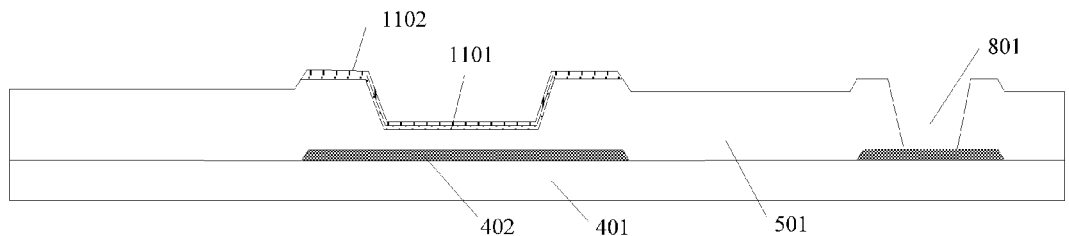
FIG. 11 is a schematic view showing the substrate formed with an active layer according to an embodiment of the present invention.

Step 308: depositing the layer of A–Si:H and the layer of N+Si:H on the pattern of the region between the source electrode and the drain electrode corresponding to the pattern of the gate electrode by a one-time patterning process, and forming an active layer. FIG. 11 is a schematic view showing the substrate with the active layer, where 1101 represents the layer of A–Si:H in the active layer, and 1102 represents the layer of N+Si:H in the active layer.

Figure 12:
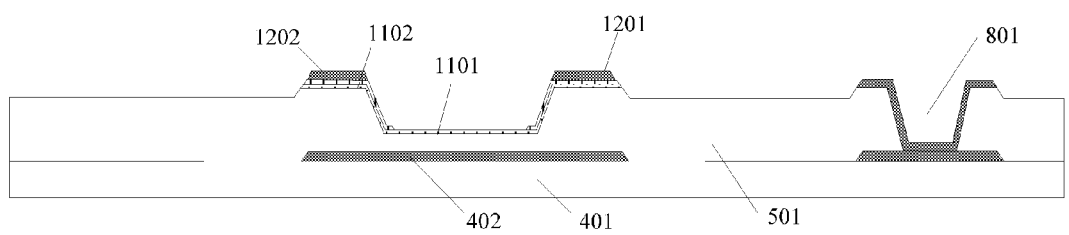
FIG. 12 is a schematic view showing the substrate formed with the source electrodes and the drain electrodes according to an embodiment of the present invention.

Step 309: forming the patterns of the source electrode and the drain electrode on the substrate with the pattern of the active layer and the pattern of the via-hole by a one-time patterning process. FIG. 12 is a schematic view showing the substrate with the source electrode and the drain electrode, where 1201 represents the drain electrode, and 1202 represents the source electrode.

Figure 13:
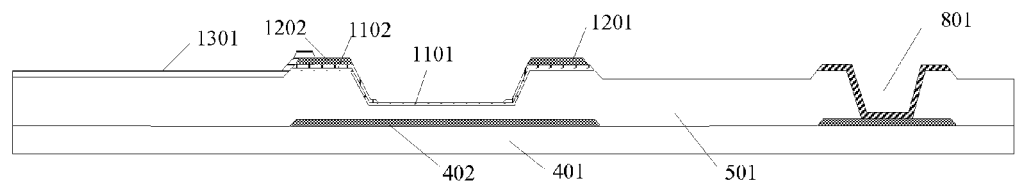
FIG. 13 is a schematic view showing the substrate formed with a pattern of pixel electrodes according to an embodiment of the present invention.

Step 310: forming the first ITO layer on the substrate with the source electrode and the drain electrode by a one-time patterning process, and forming the pattern of the pixel electrode. FIG. 13 is a schematic view showing the substrate with the pattern of the pixel electrode, where 1301 represents the first ITO layer.

Figure 14:
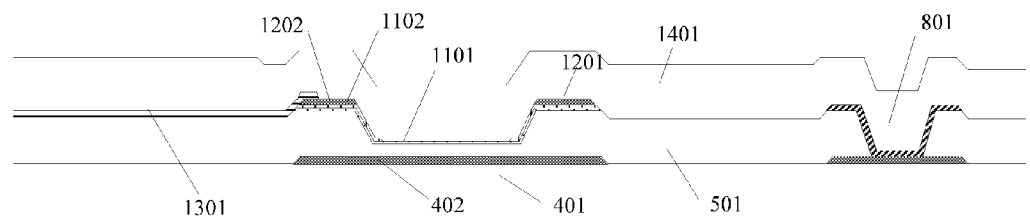
FIG. 14 is a schematic view showing the substrate on which a passivation layer is deposited according to an embodiment of the present invention.

Step 311: depositing the passivation layer on the substrate with the pattern of the pixel electrode, the passivation layer may have a thickness of 6000 Å. FIG. 14 is a schematic view showing the substrate with the passivation layer, where 1401 represents the passivation layer.

Step 312: forming the via-hole in the passivation layer by a one-time patterning process, and transmitting the signal to the source electrode, the drain electrode and the gate electrode through the via-hole.

Figure 15:
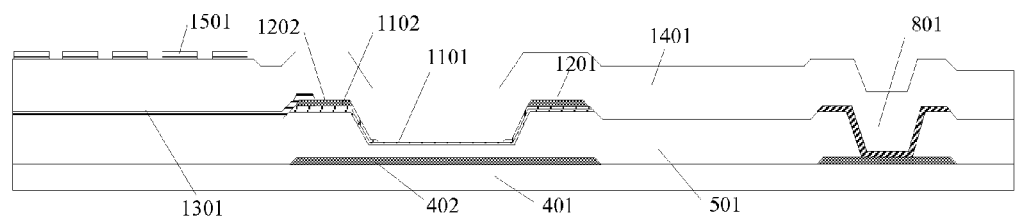
FIG. 15 is a schematic view showing the array substrate according to an embodiment of the present invention.
Figure 16:
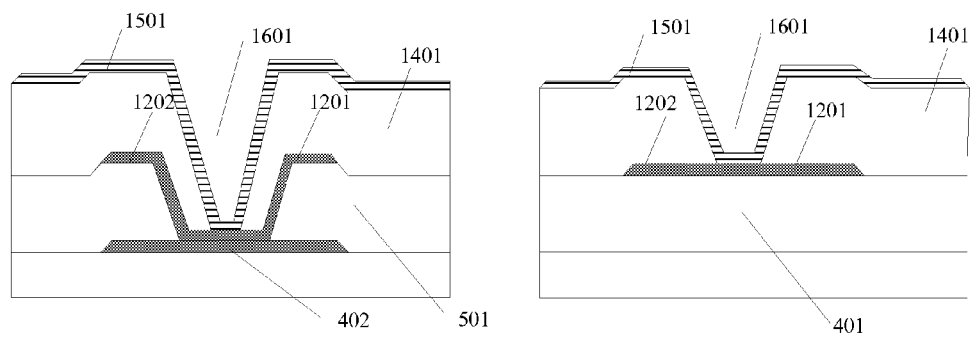
FIG. 16 is a sectional view of the array substrate at a via-hole in the passivation layer according to an embodiment of the present invention.

Step 313: depositing the second ITO layer on the substrate with the passivation layer, and etching the second ITO layer into a bar-like structure by a one-time patterning process, so as to form the pattern of the slit-like common electrode, thereby to form the array substrate. FIG. 15 is a schematic view showing the array substrate, where 1501 represents the second ITO layer. FIG. 16 is a sectional view of the array substrate at the via-hole in the passivation layer, where 1501 represents the second ITO layer, and 1601 represents the via-hole in the passivation layer.

Second Embodiment

Figure 17:
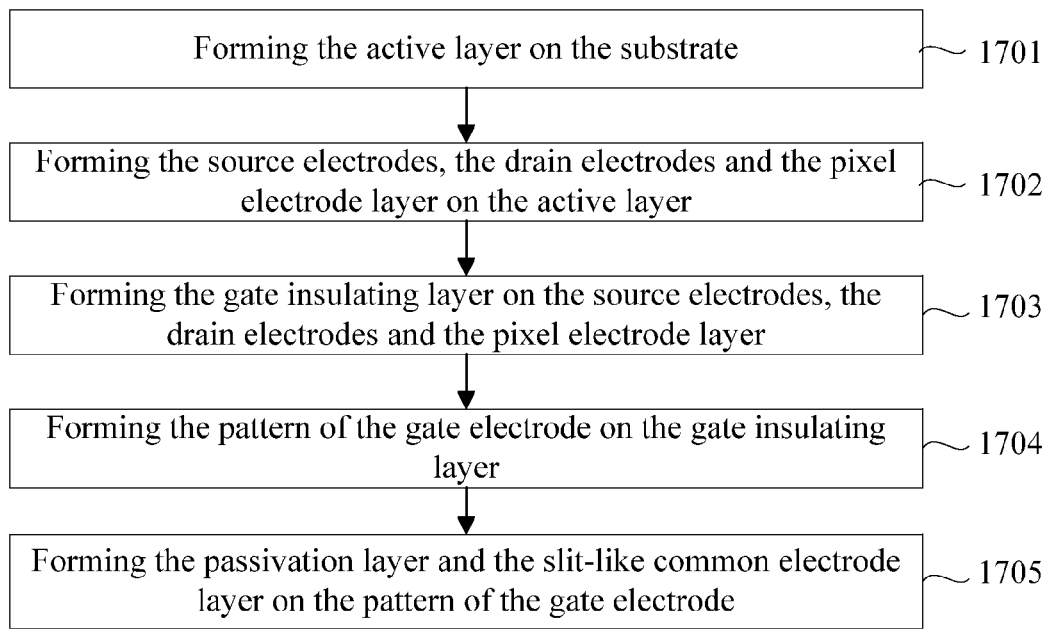
FIG. 17 is a flow chart of the method for manufacturing the array substrate where the pattern of the gate electrode is located at a side away from the substrate according to an embodiment of the present invention.

As shown in FIG. 17, the method for manufacturing the array substrate where the pattern of the gate electrode is located at a side away from the substrate comprises the following steps:

Step 1701: forming the active layer on the substrate;

Step 1702: forming the source electrodes, the drain electrodes and the pixel electrode layer on the active layer;

Step 1703: forming the gate insulating layer on the source electrodes, the drain electrodes and the pixel electrode layer;

Step 1704: forming the pattern of the gate electrode on the gate insulating layer; and Step 1705: forming the passivation layer and the slit-like common electrode layer on the pattern of the gate electrode.

Step 1701 comprises: depositing the layer of A–Si:H and the layer of N+Si:H on the substrate by a one-time patterning process, and forming the active layer. In the active layer, N+Si:H is a semiconductor material and can produce electrons. When the current flows therethrough, it is able to weaken the energy barriers of the source electrode and the drain electrode.

Step 1702 comprises: forming the source electrodes and the drain electrodes on the substrate with the active layer by a one-time patterning process; depositing a layer of materials for forming the source electrode and the drain electrode on the pattern of the via-hole; and removing the materials for forming the source electrode and the drain electrode deposited on the pattern of the region between the source electrode and the drain electrode by a one-time patterning process using a wet etching method, and removing N+Si:H deposited on the pattern of the region between the source electrode and the drain electrode using a dry etching method. The materials for forming the source electrode and the drain electrode include, but not limited to, Mo, and Mo/Al/Mo. The first ITO layer is formed on the substrate with the source electrode and the drain electrode as the pixel electrode, and a pattern of the pixel electrode is formed so as to be connected to the drain electrode.

In Step 1703, forming the gate insulating layer having a thickness about twice the thickness of the gate insulating layer in the prior art, i.e., about 6000 Å to 8000 Å, on the substrate with the patterns of the source electrode and the drain electrode as well as the pattern of the active layer.

In Step 1703, the layer of photoresist is coated onto the gate insulating layer, the photoresist in the region between the source electrode and the drain electrode is subjected to a half-exposure treatment by an exposure and development process, and the photoresist in the via-hole region is subjected to a full-exposure treatment. All the photoresist in the via-hole region and the photoresist with a certain thickness that has been exposed in the region between the source electrode and the drain electrode are removed through an exposure and development treatment. The entire gate insulating layer in the via-hole region is removed by an etching process, and the pattern of the via-hole is formed. The remaining photoresist in the region between the source electrode and the drain electrode is removed by an ashing process, and the then the gate insulating layer having a predetermined thickness in the region between the source electrode and the drain electrode is removed by an etching process, so that the remaining gate insulating layer in the region between the source electrode and the drain electrode has a thickness substantially equal to the gate insulating layer in the prior art. The remaining the gate insulating layer may have a thickness of about 3000 Å to 4000 Å.

Step 1704 comprises forming the pattern of the gate electrode on the substrate with the gate insulating layer. The gate insulating layer between the source and drain electrodes and the pattern of the gate electrode may have a thickness of about 6000 Å to 8000 Å, and a thickness of the gate insulating layer between the active layer and the pattern of the gate electrode may be 3000 Å to 4000 Å.

Step 1705 comprises: depositing the passivation layer on the substrate with the pattern of gate electrode and forming the via-hole in the passivation layer by a one-time patterning process; depositing the second ITO layer on the substrate with the passivation layer, and etching the second ITO layer into a bar-like structure by a one-time patterning process so as to form the pattern of the slit-like common electrode; and transmitting the signal to the source electrode, the drain electrode and the gate electrode through the second ITO layer and the via-hole in the passivation layer.

Figure 18:
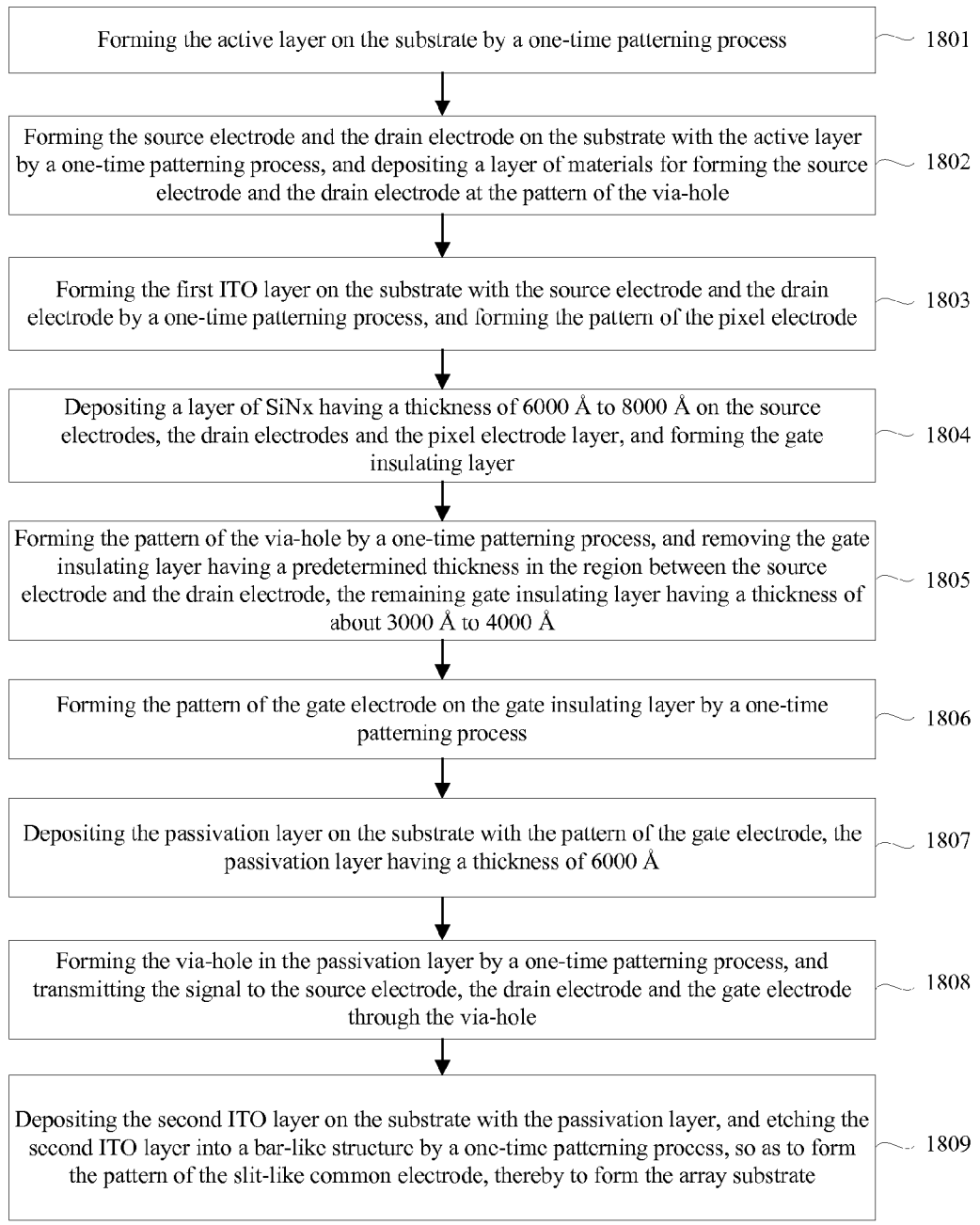
FIG. 18 is a specific flow chart of the method for manufacturing the array substrate where the pattern of the gate electrode is located at a side away from the substrate according to an embodiment of the present invention.

As shown in FIG. 18, the method for manufacturing the array substrate where the pattern of the gate electrode is located at a side away from the substrate comprises the following steps.

Figure 19:
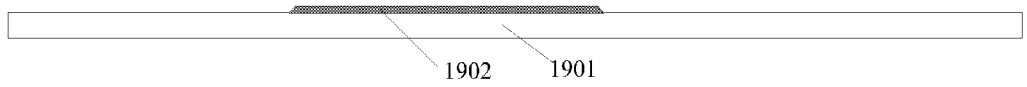
FIG. 19 is a schematic view showing another substrate formed with the active layer according to an embodiment of the present invention.

Step 1801: forming the active layer on the substrate by a one-time patterning process. FIG. 19 is a schematic view showing the substrate with the active layer, where 1901 represents the substrate, and 1902 represents the pattern of the active layer.

Figure 20:
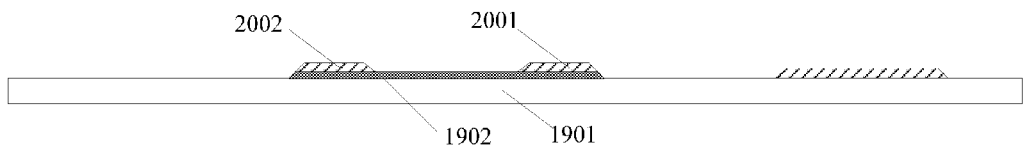
FIG. 20 is a schematic view showing another substrate on which the source electrodes and the drain electrodes are deposited according to an embodiment of the present invention.

Step 1802: forming the source electrode and the drain electrode on the substrate with the active layer by a one-time patterning process, and depositing a layer of materials for forming the source electrode and the drain electrode at the pattern of the via-hole. FIG. 20 is a schematic view showing the substrate on which the source electrode and the drain electrode are deposited, where 2001 represents the drain electrode, and 2002 represents the source electrode.

Figure 21:
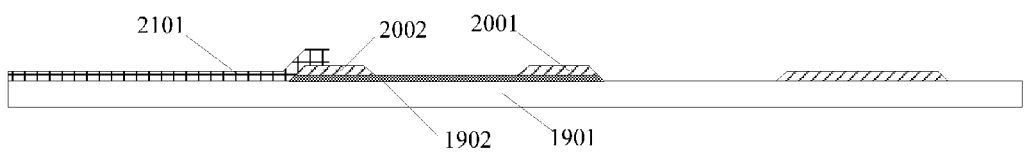
FIG. 21 is a schematic view showing another substrate formed with the pattern of the pixel electrode according to an embodiment of the present invention.

Step 1803: forming the first ITO layer on the substrate with the source electrode and the drain electrode by a one-time patterning process, and forming the pattern of the pixel electrode. FIG. 21 is a schematic view showing the substrate with the pattern of the pixel electrode, where 2101 represents the first ITO layer.

Figure 22:
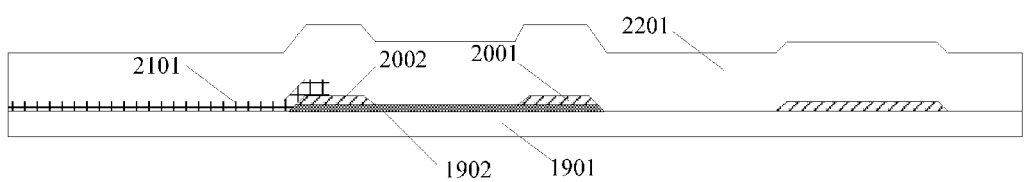
FIG. 22 is a schematic view showing another substrate on which the gate insulating layer is deposited according to an embodiment of the present invention.

Step 1804: depositing a layer of SiNx having a thickness of 6000 Å to 8000 Å on the source electrodes, the drain electrodes and the pixel electrode layer, and forming the gate insulating layer. FIG. 22 is a schematic view showing the substrate on which the gate insulating layer is deposited, where 2201 represents the gate insulating layer.

Figure 23:
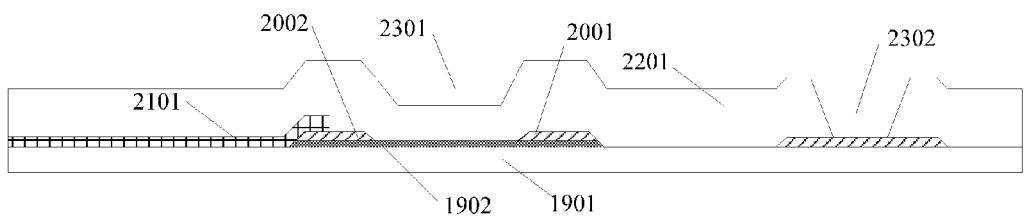
FIG. 23 is a schematic view showing another substrate, on which a pattern of a via-hole is formed and from which the gate insulating layer having a predetermined thickness within the region between the source electrode and the drain electrode is removed, according to an embodiment of the present invention.

Step 1805: forming the pattern of the via-hole by a one-time patterning process, and removing the gate insulating layer having a predetermined thickness in the region between the source electrode and the drain electrode, the remaining gate insulating layer having a thickness of about 3000 Å to 4000 Å. FIG. 23 is a schematic view showing the substrate on which the pattern of the via-hole is formed and from which the gate insulating layer having a predetermined thickness in the region between the source electrode and the drain electrode is removed, where 2301 represents the pattern of the region between the source electrode and the drain electrode, and 2302 represents the pattern of the via-hole.

Figure 24:
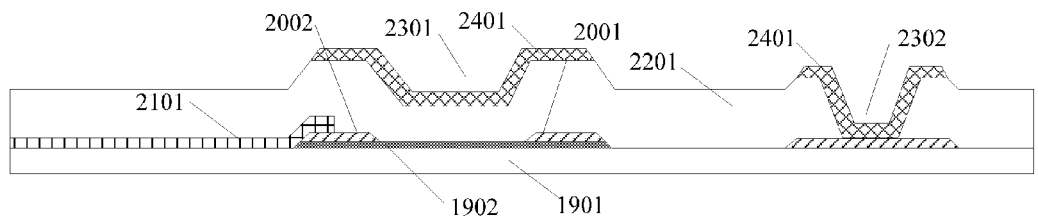
FIG. 24 is a schematic view showing another substrate formed with the pattern of the gate electrode according to an embodiment of the present invention.

Step 1806: forming the pattern of the gate electrode on the gate insulating layer by a one-time patterning process. FIG. 24 is a schematic view showing the substrate with the pattern of the gate electrode, where 2401 represents the pattern of the gate electrode.

Figure 25:
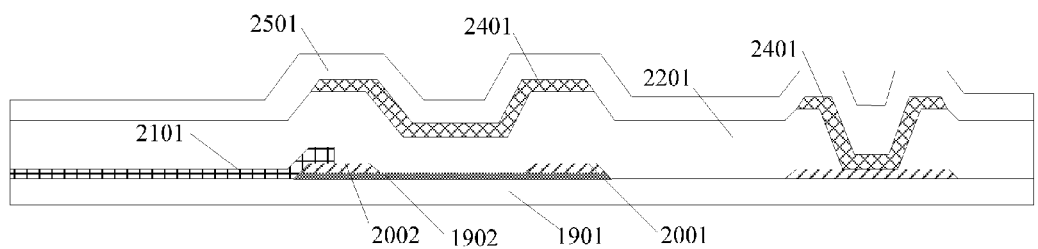
FIG. 25 is a schematic view showing another substrate on which the passivation layer is deposited according to an embodiment of the present invention.

Step 1807: depositing the passivation layer on the substrate with the pattern of the gate electrode, the passivation layer having a thickness of 6000 Å. FIG. 25 is a schematic view showing the substrate on which the passivation layer is deposited, where 2501 represents the passivation layer.

Step 1808: forming the via-hole in the passivation layer by a one-time patterning process, and transmitting the signal to the source electrode, the drain electrode and the gate electrode through the via-hole.

Figure 26:
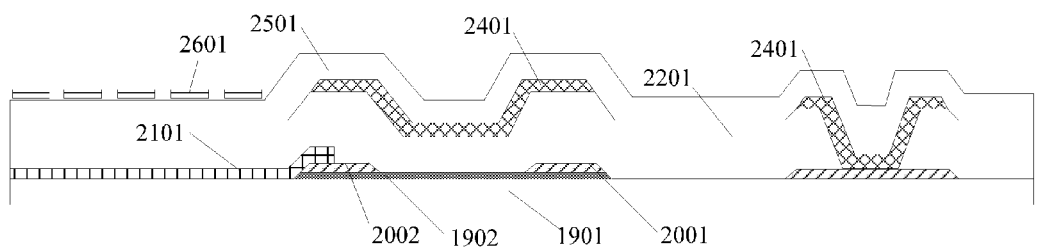
FIG. 26 is a schematic view showing another array substrate according to an embodiment of the present invention.

Step 1809: depositing the second ITO layer on the substrate with the passivation layer, and etching the second ITO layer into a bar-like structure by a one-time patterning process, so as to form the pattern of the slit-like common electrode, thereby to form the array substrate. FIG. 26 is a schematic view showing the array substrate, where 2601 represents the second ITO layer.

Figure 27:
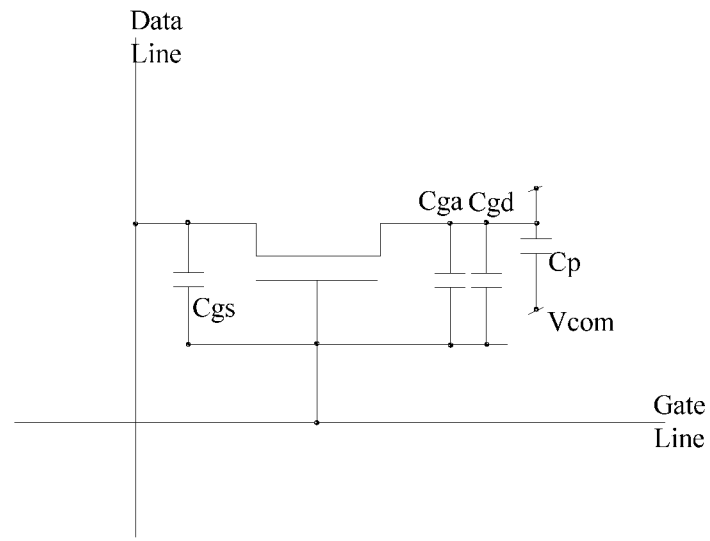
FIG. 27 is a circuit diagram of a pixel unit when the region of the array substrate between the source electrode and the drain electrode is in an on state according to an embodiment of the present invention.

FIG. 27 is a circuit diagram of a pixel unit when the region of the array substrate in the region between the source electrode and the drain electrode is in an on state. In the array substrate, the source electrode and the gate electrode form the capacitor Cgs, the drain electrode and the gate electrode form the capacitor Cgd, and the active layer and the gate electrode form the capacitor Cga. When the region between the source electrode and the drain electrode is in the on state, the current flows through the source electrode, then through the region between the source electrode and the drain electrode to form the channel, then through the drain electrode, and finally to the pixel electrode, so as to control an on or off state of the pixel electrode. The capacitor Cga formed by the active layer and the gate electrode is located in the region between the active layer and the drain electrode, so as to form the channel after receiving the current, so the capacity of the capacitor shall not be too small. Otherwise, the current flowing therethrough will be relatively small, and as a result, it is easy to cause a muted color excited in a pixel unit, thereby to cause an adverse display effect. The capacitors formed by the source and drain electrodes and the gate electrode will block the flow of the current. When the current flows through these two capacitors, a relatively large current intensity is required so as to break the energy barriers of the capacitors, and a large amount of electric energy will be converted into thermal energy or the others. As a result, the energy loss will occur. Hence, the capacitors formed by the source and drain electrodes and the gate electrode are required to have small capacity. The thicker the insulating dielectric layer between the source and drain electrodes and the gate electrode, the smaller the capacity of the capacitors formed by the source and drain electrodes and the gate electrode, and the less the electric energy loss. Hence, in this embodiment, the gate insulating layer between the source and drain electrodes and the gate electrode has a thickness twice an ordinary insulating layer, so as to remarkably reduce the energy loss. In addition, the gate insulating layer between the active layer and the gate electrode has a small thickness, and the capacitor Cga formed thereby remains unchanged, i.e., it is able to ensure the capacity of the capacitor Cga and reduce the capacity of the capacitors Cgs and Cgd. As can be seen from the following equation 1-1, the current intensity will decrease along with a decrease in the desired voltage strength, and as a result, the power consumption of the array substrate will decrease too.

$$I_{ds}=I_{on}=\mu_{eff}(\epsilon_{ins}\epsilon_0/t_{ins})(W/L)(V_{gs}-V_{th})V_{ds} \quad (1\text{-}1)$$

In the equation, $I_{ds}$ represents the current for the source and drain electrodes, $I_{on}$ represents an on-state current for the channel, $\mu_{eff}$ represents the equivalent carrier mobility, $\epsilon_{ins}$ represents a dielectric constant of the gate insulating layer, $\epsilon_0$ represents a vacuum dielectric constant, $t_{ins}$ represents the thickness of the gate insulating layer in the region between the source electrode and the drain electrode, $\epsilon_{ins}\epsilon_0/t_{ins}$ represents the capacitance of the gate insulating layer per unit area, W represents a width of the region between the source electrode and the drain electrode, L represents a length of the region between the source electrode and the drain electrode, $v_{gs}$ represents a voltage between the gate electrode and the source electrode, $v_{ds}$ represents a voltage between the gate electrode and the drain electrode, and $v_{th}$ represents a threshold voltage. Because the capacitance per unit area decreases while the voltage between the gate electrode and the source electrode and the voltage between the gate electrode and the drain electrode remain unchanged, so it is able to maintain $I_{on}$ at a current level when power consumption is reduced.

Figure 28:
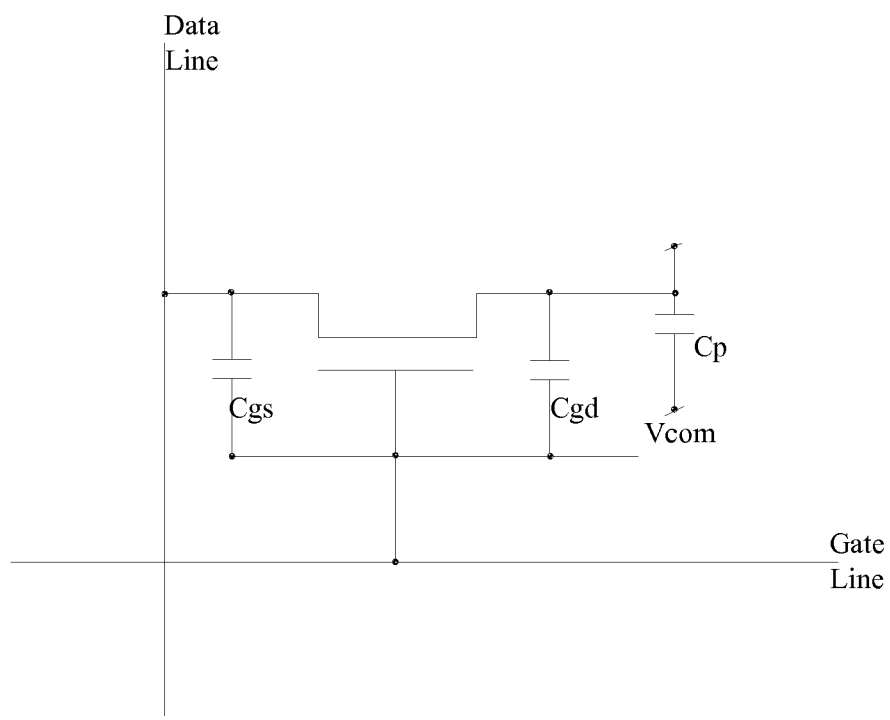
FIG. 28 is a circuit diagram of the pixel unit when the region of the array substrate between the source electrode and the drain electrode is in an off state according to an embodiment of the present invention.

FIG. 28 is a circuit diagram of the pixel unit when the region of the array substrate between the source electrode and the drain electrode is in an off state. The source electrode and the drain electrode form the capacitor Cgs, and the drain electrode and the gate electrode form the capacitor Cgd. Gate Line represents a gate line, while Data Line represents a data line. Because the capacity of the capacitors Cgd and Cgs decreases, the consumed electric energy will decrease too, and as a result, it is able to reduce the power consumption of the array substrate.

On the basis of an identical inventive concept, the present invention further provides an array substrate. The principle of the array substrate for solving the technical problems is similar to that mentioned in the method for manufacturing an array substrate in the first embodiment, so the implementation of the array substrate may refer to those mentioned above, and it will not be repeated herein.

The array substrate comprises a gate insulating layer; an active layer, a source electrode and a drain electrode covering one side of the gate insulating layer; and a pattern of a gate electrode covering the other side of the gate insulating layer. The gate insulating layer between the source and drain electrodes and the pattern of the gate electrode has a thickness greater than that of the gate insulating layer between the active layer, located between the source electrode and the drain electrode, and the pattern of the gate electrode.

Figure 29:
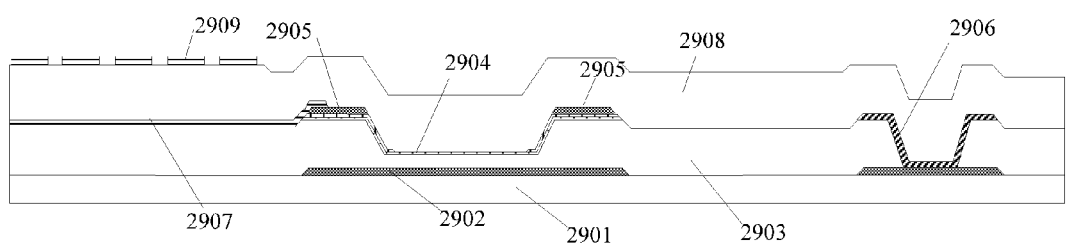
FIG. 29 is a schematic view showing the array substrate where the pattern of the gate electrode is located at a side adjacent to the substrate according to an embodiment of the present invention.

As shown in FIG. 29, the array substrate where the pattern of the gate electrode is located at a side adjacent to a substrate comprises: the substrate 2901; the gate electrode 2902 formed on the substrate 2901; the gate insulating layer 2903 formed on the gate electrode and on a region of the substrate which is not covered by the gate electrode; the active layer 2904 formed on the pattern of the gate electrode; the source and drain electrodes 2905 and a pixel electrode 2907 formed on the active layer; a pattern 2906 of a via-hole formed on the gate insulating layer and connected to the pattern of the gate electrode; a first ITO layer 2907 formed on the gate insulating layer and connected to the drain electrode; a passivation layer 2908 covering the source electrode, the drain electrode, the first ITO layer and pattern of the via-hole; the via-hole (not shown) formed in the passivation layer; and a second ITO layer 2909 formed on the passivation layer. The gate insulating layer between the active layer and the pattern of the gate electrode may have a thickness of 3000 Å to 4000 Å, and the gate insulating layer between the source and drain electrodes and the pattern of the gate electrode may have a thickness of 6000 Å to 8000 Å. The pattern of the via-hole is covered with materials for forming the source electrode and the drain electrode, and the passivation layer may have a thickness of about 6000 Å. A signal is transmitted to the source electrode, the drain electrode and the gate electrode through the second ITO layer and the via-hole in the passivation layer.

Figure 30:
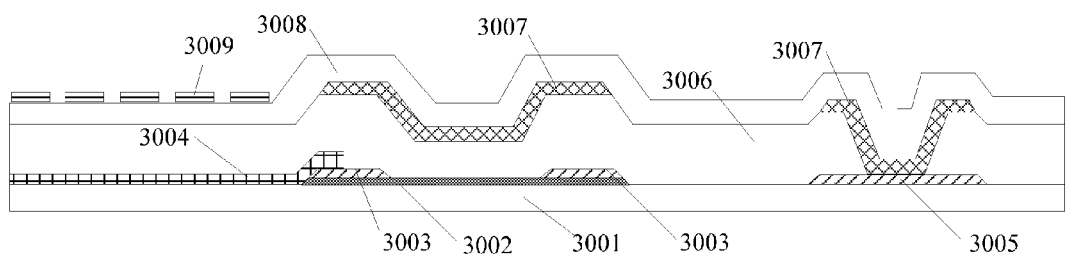
FIG. 30 is a schematic view showing the array substrate where the pattern of the gate electrode is located at a side away from the substrate according to an embodiment of the present invention.

As shown in FIG. 30, the array substrate where the pattern of the gate electrode is located at a side away from the substrate comprises: the substrate 3001; the active layer 3002 formed on the substrate; a layer of the source and drain electrodes 3003 and the pixel electrode layer 3004 formed on the active layer; patterns 3005 of the source and drain electrodes formed on the substrate; the gate insulating layer 3006 formed on the source electrodes, the drain electrodes and the pixel electrode layer and above a region of the substrate which is not covered with the active layer; the pattern 3007 of the gate electrode formed on the gate insulating layer; the passivation layer 3008 covering the gate insulating layer 3006 and the pattern 3007 of the gate electrode; the via-hole (not shown) formed in the passivation layer; and the second ITO layer 3009 formed on the passivation layer. The pixel electrode is connected to the drain electrode. The pattern 3007 of the gate electrode is connected to the patterns 3005 of the source electrode and the drain electrode on the substrate through the pattern of the via-hole. The gate insulating layer between the active layer and the pattern of the gate electrode may have a thickness of 3000 Å to 4000 Å, and the gate insulating layer between the source and drain electrodes and the pattern of the gate electrode may have a thickness of 6000 Å to 8000 Å. The thickness of the passivation layer may be about 6000 Å. The signal is transmitted to the source electrode, the drain electrode and the gate electrode through the second ITO layer and the via-hole in the passivation layer.

In the array substrate of this embodiment, the source electrode and the gate electrode form the capacitor Cgs, the drain electrode and the gate electrode form the capacitor Cgd, and the active layer and the gate electrode form the capacitor Cga. When the region between the source electrode and the drain electrode is in the on state, the current flows through the source electrode, then through the region between the source electrode and the drain electrode to form the channel, then through the drain electrode, and finally to the pixel electrode, so as to control an on or off state of the pixel electrode. The capacitor Cga formed by the active layer and the gate electrode is located in the region between the active layer and the drain electrode, so as to form the channel after receiving the current, so the capacity of the capacitor shall not be too small. Otherwise, the current flowing therethrough will be relatively small, and as a result, it is easy to cause a muted color excited in a pixel unit, thereby to cause an adverse display effect. The capacitors formed by the source and drain electrodes and the gate electrode will block the flow of the current. When the current flows through these two capacitors, a relatively large current intensity is required so as to break the energy barriers of the capacitors, and a large amount of electric energy will be converted into thermal energy or the others. As a result, the energy loss will occur. Hence, the capacitors formed by the source and drain electrodes and the gate electrode are required to have small capacity. The thicker the insulating dielectric layer between the source and drain electrodes and the gate electrode, the smaller the capacity of the capacitors formed by the source and drain electrodes and the gate electrode, and the less the electric energy loss. Hence, in this embodiment, the gate insulating layer between the source and drain electrodes and the gate electrode has a thickness twice an ordinary insulating layer, so as to remarkably reduce the energy loss. In addition, the gate insulating layer between the active layer and the gate electrode has a small thickness, and the capacitor Cga formed thereby remains unchanged, i.e., it is able to ensure the capacity of the capacitor Cga and reduce the capacity of the capacitors Cgs and Cgd.

When the region of the array substrate between the source electrode and the drain electrode is in an off state, the source electrode and the gate electrode form the capacitor Cgs, and the drain electrode and the gate electrode form the capacitor Cgd. Because the capacity of the capacitors Cgd and Cgs decreases, the consumed electric energy will decrease too, and as a result, it is able to reduce the power consumption of the array substrate.

The present invention further provides a display device comprising any one of the above-mentioned array substrates.

It should be appreciated that, although the preferred embodiments are described above, a person skilled in the art may make modifications and alterations to these embodiments in accordance with the basic concept of the present invention. So, the attached claims are intended to include the preferred embodiments and all of the modifications and alterations that fall within the scope of the present invention.

Obviously, a person skilled in the art may make further modifications and alterations without departing from the spirit and the scope of the present invention. If these modifications and alterations fall within the scope of the appended claims and the equivalents thereof, the present invention is also intended to include these modifications and alternations.

What is claimed is:

1. A method for manufacturing an array substrate, comprising:
    subjecting a gate insulating layer in a region between a source electrode and a drain electrode to a partial etching treatment by a one-time patterning process;
    forming an active layer by a one-time patterning process, the active layer covering a partially-etched region of the gate insulating layer, and the active layer being located between a first portion of a gate electrode and the source and drain electrodes; and
    forming the gate electrode by a one-time patterning process, the gate electrode also including a second portion that is separated from the first portion of the gate electrode,
    wherein the first and second portions of the gate electrode are located at different sides of the gate insulating layer, and a first thickness of the gate insulating layer between (i) the source and drain electrodes and (ii) the first portion of the gate electrode is greater than a second thickness of the gate insulating layer between (i) the active layer and the first portion of the gate electrode, the second thickness being at a location between the source and drain electrodes.

2. The method according to claim 1, wherein the step of subjecting the gate insulating layer in the region between the source electrode and the drain electrode to the partial etching treatment by a one-time patterning process comprises:

subjecting the gate insulating layer in the region between the source electrode and the drain electrode to a partial etching treatment by a half-exposure process, and subjecting a via-hole region of the gate insulating layer to a full-exposure treatment, so as to form a via-hole in the gate insulating layer.

3. The method according to claim 1, wherein when the gate electrode is located at a side adjacent to a substrate, the method comprises:
forming the first and second portions of the gate electrode on the substrate;
forming the gate insulating layer on the substrate with the gate electrode;
forming the active layer on the gate insulating layer;
forming the source electrode, the drain electrode and a pixel electrode layer on the active layer; and
forming a passivation layer and a slit-like common electrode layer on the source electrode, the drain electrode and the pixel electrode layer, the pixel electrode being electrically connected to the drain electrode.

4. The method according to claim 1, wherein when the pattern of the gate electrode is located at a side away from a substrate, the method comprises:
forming the active layer on the substrate;
forming the source electrode, the drain electrode and a pixel electrode layer on the active layer;
forming the gate insulating layer on the source electrode, the drain electrode and the pixel electrode layer;
forming the first and second portions of the gate electrode on the gate insulating layer; and
forming a passivation layer and a slit-like common electrode layer on the pattern of the gate electrode.

5. The method according to claim 1, wherein the first thickness of the gate insulating layer between (i) the source and drain electrodes and (ii) the first portion of the gate electrode is 6000 Å to 8000 Å.

6. The method according to claim 2, wherein the first thickness of the gate insulating layer between (i) the source and drain electrodes and (ii) the first portion of the gate electrode is 6000 Å to 8000 Å.

7. The method according to claim 3, wherein the first thickness of the gate insulating layer between (i) the source and drain electrodes and (ii) the first portion of the gate electrode is 6000 Å to 8000 Å.

8. The method according to claim 5, wherein the second thickness of the gate insulating layer between (i) the active layer and the first portion of the gate electrode, at the location between the source and drain electrodes, is 3000 Å to 4000 Å.

9. An array substrate, comprising:
a gate insulating layer;
an active layer, a source electrode, and a drain electrode, the active layer, the source electrode, the drain electrode, and a first portion of a gate electrode located at one side of the gate insulating layer,
the active layer being located between (i) the first portion of the gate electrode and (ii) the source and drain electrodes; and
a second portion of the gate electrode, the second portion of the gate electrode separated from the first portion of the gate electrode, and the second portion of the gate electrode at the other side of the gate insulating layer,
wherein a first thickness of the gate insulating layer between (i) the source and drain electrodes and (ii) the first portion of the gate electrode is greater than a second thickness of the gate insulating layer between (i) the active layer and the first portion of the gate electrode, the second thickness being at a location between the source and drain electrodes.

10. The array substrate according to claim 9, wherein when the gate electrode is located at a side adjacent to a substrate, the array substrate comprises:
the first and second portions of the gate electrode formed on the substrate;
the gate insulating layer formed on of the gate electrode and the substrate;
the active layer formed on the gate insulating layer;
the source electrode, the drain electrode and a pixel electrode layer formed on the active layer; and
a passivation layer and a slit-like common electrode layer formed on the source electrode, the drain electrode and the pixel electrode layer, the pixel electrode being electrically connected to the drain electrode.

11. The array substrate according to claim 9, wherein when the gate electrode is located at a side away from a substrate, the array substrate comprises:
the active layer formed on the substrate;
the source electrode, the drain electrode and a pixel electrode layer formed on the active layer;
the gate insulating layer formed on the source electrode, the drain electrode and the pixel electrode layer;
the first and second portions of the gate electrode formed on the gate insulating layer; and
a passivation layer and a slit-like common electrode layer formed on the pattern of the gate electrode.

12. The array substrate according to claim 9, wherein the first thickness of the gate insulating layer between (i) the source and drain electrodes and (ii) the first portion of the gate electrode is 6000 Å to 8000 Å.

13. The array substrate according to claim 10, wherein the first thickness of the gate insulating layer between (i) the source and drain electrodes and (ii) the first portion of the gate electrode is 6000 Å to 8000 Å.

14. The array substrate according to claim 11, wherein the first thickness of the gate insulating layer between (i) the source and drain electrodes and (ii) the first portion of the gate electrode is 6000 Å to 8000 Å.

15. The array substrate according to claim 12, wherein the second thickness of the gate insulating layer between (i) the active layer and the first portion of the gate electrode, at the location between the source and drain electrodes, is 3000 Å to 4000 Å.

16. A display device, comprising the array substrate according to claim 9.

17. The display device according to claim 16, wherein when the gate electrode is located at a side adjacent to a substrate, the array substrate comprises:
the first and second portions of the gate electrode formed on the substrate;
the gate insulating layer formed on the gate electrode and the substrate;
the active layer formed on the gate insulating layer;
the source electrode, the drain electrode and a pixel electrode layer formed on the active layer; and
a passivation layer and a slit-like common electrode layer formed on the source electrode, the drain electrode and the pixel electrode layer, the pixel electrode being electrically connected to the drain electrode.

18. The display device according to claim 16, wherein when the gate electrode is located at a side away from a substrate, the array substrate comprises:
the active layer formed on the substrate;
the source electrode, the drain electrode a the pixel electrode layer formed on the active layer;

the gate insulating layer formed on the source electrode, the drain electrode and the pixel electrode layer;

the first and second portions of the gate electrode formed on the gate insulating layer; and a passivation layer and a slit-like common electrode layer formed on the pattern of the gate electrode.

19. The display device according to claim 16, wherein the first thickness of the gate insulating layer between (i) the source and drain electrodes and (ii) the first portion of the gate electrode is 6000 Å to 8000 Å.

20. The display device according to claim 19, wherein the second thickness of the gate insulating layer between (i) the active layer and the first portion of the gate electrode, at the location between the source and drain electrodes, is 3000 Å to 4000 Å.

* * * * *